United States Patent [19]

Miyake

[11] Patent Number: 5,160,836
[45] Date of Patent: Nov. 3, 1992

[54] IMAGE SENSOR INCLUDING A PLURALITY OF LIGHT-RECEIVING ARRAYS AND METHOD OF DRIVING THE SAME

[75] Inventor: Hiroyuki Miyake, Kanagawa, Japan
[73] Assignee: Fuji Xerox Co., Ltd., Tokyo, Japan
[21] Appl. No.: 675,276
[22] Filed: Mar. 26, 1991
[30] Foreign Application Priority Data

Mar. 27, 1990 [JP] Japan .................................. 2-75772

[51] Int. Cl.$^5$ .......................................... H01L 27/146
[52] U.S. Cl. ................................................. 250/208.1
[58] Field of Search .................................... 250/208.1

[56] References Cited

U.S. PATENT DOCUMENTS 5,060,071 10/1991 Ino .................................. 358/213.11
5,070,236 12/1991 Miyake ............................ 250/208.1

FOREIGN PATENT DOCUMENTS

60-113573 6/1985 Japan .

Primary Examiner—Constantine Hannaher
Attorney, Agent, or Firm—Finnegan, Henderson, Farabow, Garrett and Dunner

[57] ABSTRACT

An image sensor including: a plurality of light-receiving element arrays; switching elements; first through third common connection lines; an electric charge storing unit; and a drive circuit. Each light-receiving element array extends in an auxiliary scanning direction and consists of a plurality of blocks. Each block extends in a main scanning direction and consists of a plurality of light-receiving elements. Each light-receiving element consists of a plurality of bits. Each switching element is connected to an output side of each of the light-receiving elements. Each first common connection line is commonly connected to the switching elements so that the switching elements can be driven simultaneously every block of each light-receiving element array. Each second common connection line is commonly connected to the output sides of the switching elements, each of which belongs to each light-receiving element array. Each third common connection line is commonly connected to the second common connection lines, which belong to each block. The electric charge storing unit stores electric charge transferred from the light-receiving elements by the switching elements. The drive circuit is connected to the output sides of the second common connection lines, which belong to an arbitrarily selected block. As a result of the above construction, the image signals can be read on a block basis with a single drive IC.

5 Claims, 6 Drawing Sheets

IMAGE SENSOR INCLUDING A PLURALITY OF LIGHT-RECEIVING ARRAYS AND METHOD OF DRIVING THE SAME

BACKGROUND OF THE INVENTION

The invention relates to an image sensor for reading images, and more particularly to an image sensor and a method of driving such image sensor in which a plurality of light-receiving element arrays are arranged on a single substrate and the respective light-receiving element arrays have filters for different colors (e.g., red, green and blue) so that color images can be read.

Figure 6:
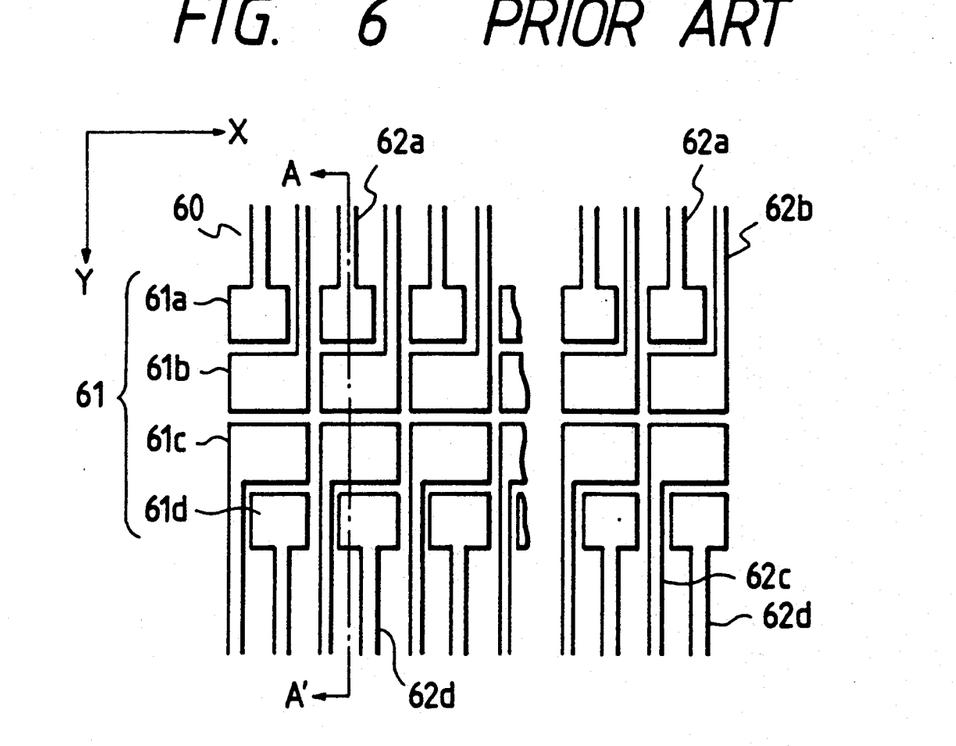
FIG. 6 is a plan view for a description of a conventional color image sensor.
Figure 7:
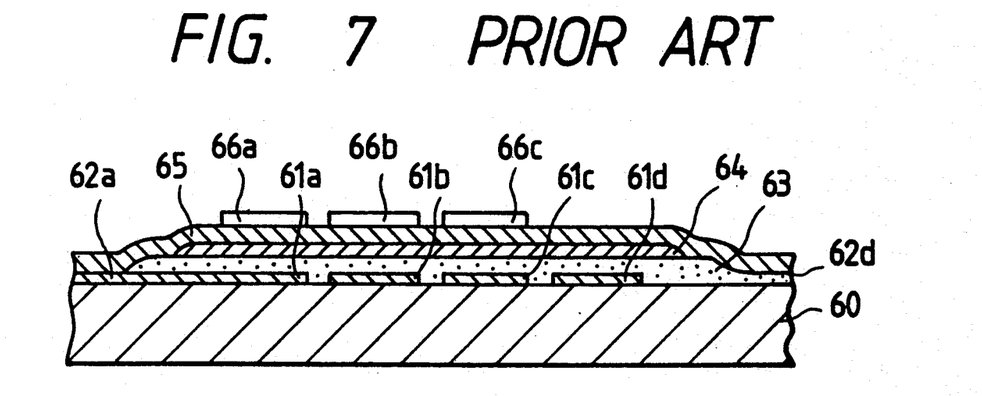
FIG. 7 is a sectional view taken along a line A—A' shown in FIG. 6.

A conventional color image sensor in which a plurality of light-receiving element arrays are arranged on a single substrate is constructed as shown by plan and sectional views in FIGS. 6 and 7, respectively.

On a substrate 60 are four vertically (an auxiliary scanning direction Y) juxtaposed arrays of pixel electrodes 61a, 61b, 61c and 61d, each array extending in a main scanning direction X, with corresponding lead electrodes 62a, 62b, 62c and 62d drawn out therefrom. The lead electrodes 62a and 62d extending from the two externally arranged pixel electrodes 61a and 61d are drawn out in directions opposite to each other, while the lead electrodes 62b and 62c extending from the two internally arranged pixel electrodes 61b and 61c are drawn out in directions opposite to each other passing between the pixel electrodes 61a and between the pixel electrodes 61d, respectively. An amorphous semiconductor film 63 is formed on the pixel electrodes 61, and a common transparent electrode 64 is formed on the amorphous semiconductor film 63. The portions interposing the amorphous semiconductor film 63 between the pixel electrodes 61 and the common transparent electrode 64 form photosensitive pixel regions, or light-receiving elements. On the common transparent electrode 64, color filters 66a, 66b and 66c, respectively confronting the pixel electrodes 61a, 61b and 61c, are disposed to color separate image data. The color filters 66a, 66b and 66c are red, green and blue ones respectively.

Figure 8:
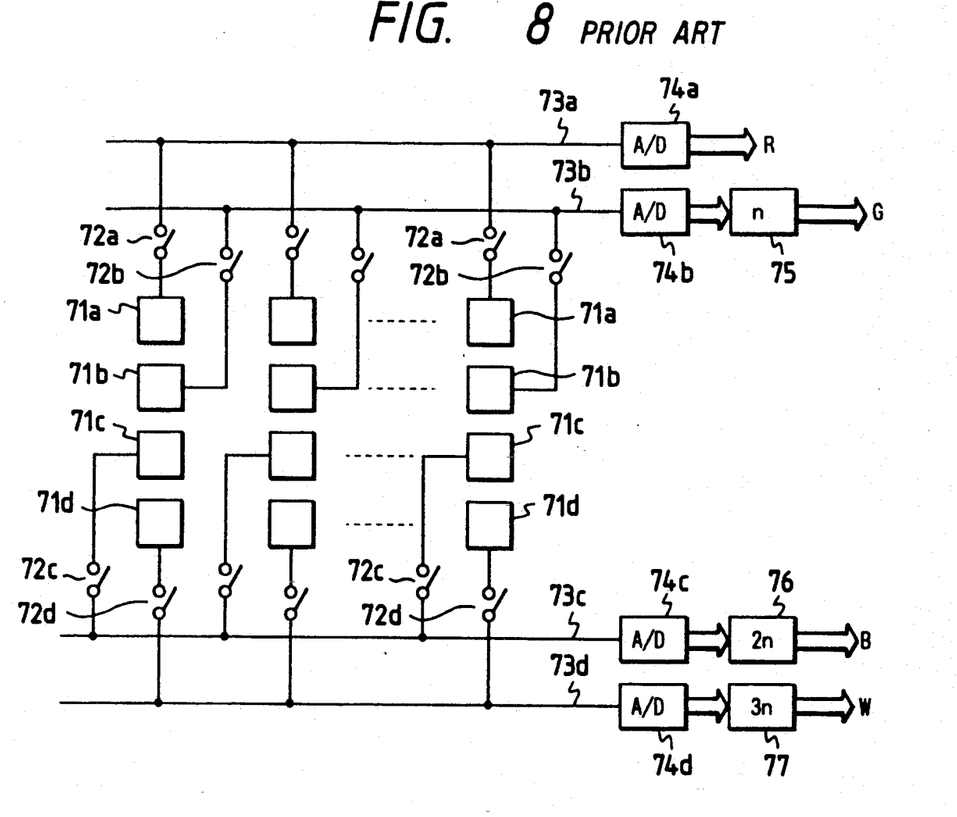
FIG. 8 is a diagram for a description of a drive circuit of the color image sensor shown in FIG. 6.

Ends of the lead electrodes 62a through 62d are connected to IC chips (not shown) through wire bonding. Each IC chip forms a drive circuit for extracting electric charges stored at each light-receiving element array. A simple equivalent circuit of a light-receiving element array and its drive circuit is shown in FIG. 8. In FIG. 8, reference numerals 71a, 71b, 71c and 71d respectively correspond to the pixel regions shown in FIG. 6 (hereinafter referred to as "R (red) pixel region, G (green) pixel region, B (blue) pixel region, and W (luminance) pixel region") and are connected to common output lines 73a, 73b, 73c and 73d through signal read switches 72a, 72b, 72c and 72d, respectively. The common output lines 73a, 73b, 73c and 73d are connected to A/D (analog-to-digital) converters 74a, 74b, 74c and 74d, respectively. The output side of the A/D converter 74b is connected to an n-stage delay register 75; the output side of the A/D converter 74c is connected to a 2n-stage delay register 76; and the output side of the A/D converter 74d is connected to a 3n-stage delay register 77 (where n is the number of pixels in a pixel region for each color extending in the main scanning direction).

Figure 9:
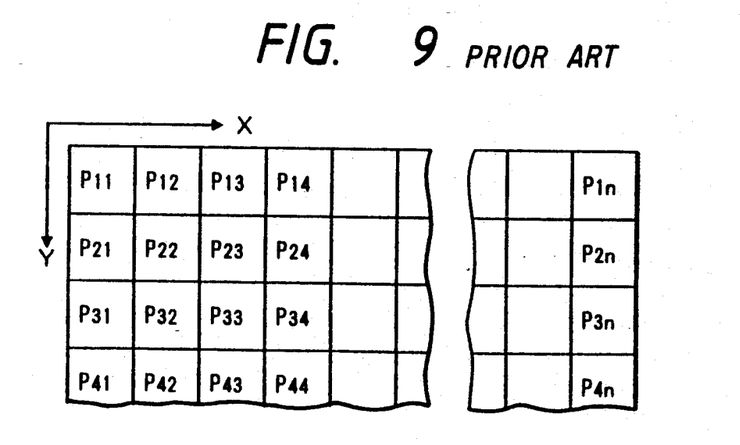
FIG. 9 is a diagram for a description of an image reading operation.

A document placed over the light-receiving element arrays are movable in the auxiliary direction by document feed means such as rollers. Let it be assumed that an image on the document to be read is represented by pixels P11-P1n, P21-P2n, P31-P3n, ... as shown in FIG. 9. When the pixels P11-P1n come to a position corresponding to the W pixel region 71d, the switch 72d is selectively and sequentially turned on from left, thereby sequentially producing the luminance data of the pixels P11-P1n as electric signals at the common output line 73d. The respective electric signals are then converted into digital values by the A/D converter 74d, transferred to the delay register 77, and stored at the 1st to n-th stages of the delay register.

Then, when the pixels P11-P1n move to a position corresponding to the B pixel region 71c, the switch 72c is selectively and sequentially turned on from left, thereby sequentially producing the blue color data of the pixels P11-P1n as electric signals at the common output line 73c. The respective electric signals are then converted into digital values by the A/D converter 74c, transferred to the delay register 76, and stored at the 1st to n-th stages of the delay register 76. Similarly, the green color data of the pixels P11-P1n are read from the G pixel region 71b and stored at the 1st to n-th stages of the delay register 75. Further, the red color data of the pixels P11-P1n are read from the R pixel region 71a. Since the delay registers 75, 76 and 77 transfer the data based on a predetermined clock, when the red signals are sequentially outputted from the pixels P11-P1n from the A/D converter 74a, the green, blue and luminance signals of the same pixels are outputted from the delay registers 75, 76 and 77 in synchronism. Data of the other pixels P21-P2n, P31-P3n, ... are read similarly (see Japanese Patent Unexamined Publication No. Sho. 60-113573).

However, such conventional construction as described above requires a separate drive circuit to be provided at each line to extract the electric signals from each light-receiving element array, thereby making the image sensor expensive.

Further, the line capacitances of the lead electrodes 62b and 62c drawn out from the pixel electrodes 61b and 61c constituting the two internal light-receiving element arrays are not equal to those of the lead electrodes 62a and 62d drawn out from the pixel electrodes 61a and 61d constituting the two external light-receiving element arrays due to different lengths of their lines. Therefore, even if light is projected equally to the respective light-receiving element arrays and the electric charges generated at the respective light-receiving element arrays are equal (Q=CV), the output voltages (V) of the respective light-receiving element arrays are not equal because their line capacitances (C) are not equal.

Furthermore, the lead electrodes 62a, 62b and 62c of the pixel electrodes 61a, 61b and 61c constituting the respective light-receiving element arrays are wire-bonded to the corresponding drive IC circuits, and this disadvantageously increases the number of wires used for the wire-bonding impairing reliability.

SUMMARY OF THE INVENTION

The invention has been made in view of the above circumstances. Accordingly, an object of the invention is to provide an image sensor and a method of driving such image sensor in which a plurality of light-receiving element arrays can be driven by a single drive circuit with reduced variations in sensitivity between the light-receiving element arrays.

To achieve the above object, an image sensor according to the invention comprises: a plurality of light-receiving element arrays; switching elements; first through third common connection lines; means for storing electric charge; and a drive circuit. Each light-receiving element array extends in an auxiliary scanning direction and consists of a plurality of blocks. Each block extends in a main scanning direction and consists of a plurality of light-receiving elements. Each light-receiving element consists of a plurality of bits. Each switching element is connected to an output side of each of the light-receiving elements. Each first common connection line is commonly connected to the switching elements so that the switching elements can be driven simultaneously every block of each light-receiving element array. Each second common connection line is commonly connected to the output sides of the switching elements, each of which belongs to each light-receiving element array. Each third common connection line is commonly connected to the second common connection lines, which belong to each block. The electric charge storing means stores electric charge transferred from the light-receiving elements by the switching elements. The drive circuit is connected to the output sides of the second common connection lines, which belong to an arbitrarily selected block.

DETAILED DESCRIPTION OF THE PREFERRED EMBODIMENTS

Figure 1:
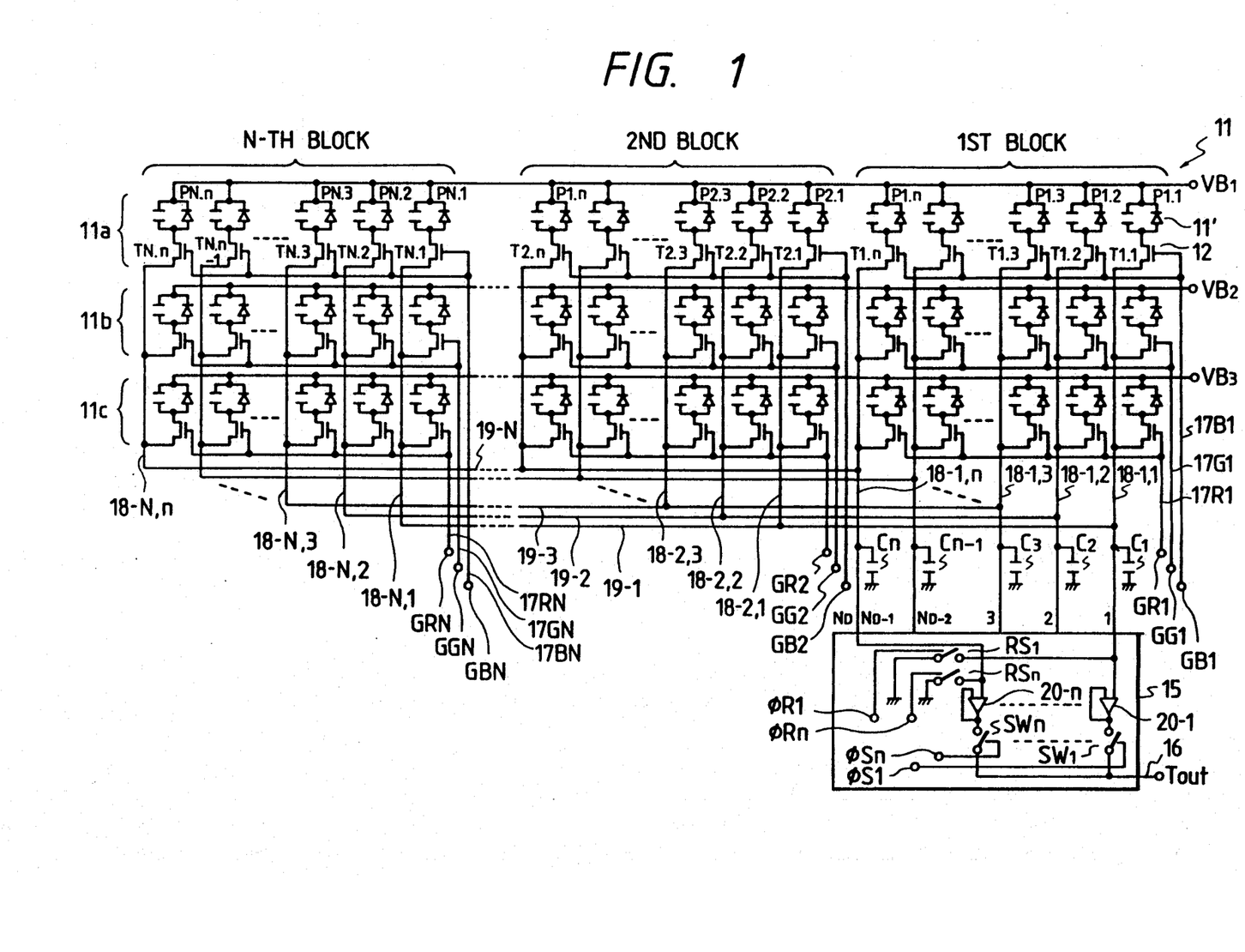
FIG. 1 is an equivalent circuit diagram of a color image sensor, which is an embodiment of the invention.

FIG. 1 shows an equivalent circuit diagram of a color image sensor which is an embodiment of the invention.

In FIG. 1, the color image sensor includes a light-receiving element array 11 (P1,1 through PN,n) extending in a main scanning direction and consisting of N blocks of light-receiving elements. Each block consists of n light-receiving elements (photodiode) 11'. A group of light-receiving element arrays is formed by juxtaposing three light-receiving element arrays 11a, 11b and 11c in an auxiliary scanning direction. The output sides of the respective light-receiving elements are connected to switching elements 12, each of which is made of a thin film transistor (TFT), while the input sides of the respective light-receiving elements commonly receive corresponding voltages VB1, VB2 and VB3.

Each of first common lines 17R1, 17G1 and 17B1 through 17RN, 17GN and 17BN is commonly connected to the gates of the switching elements 12 belonging to each block, while the other ends of the first common lines have gate terminals GR1, GG1 and GB1 through GRN, GGN and GBN every block, respectively. The switching elements 12 of each block can be driven simultaneously in accordance with signals from the gate terminals GR1, GG1 and GB1 through GRN, GGN and GBN. Each of second common lines 18-1,1 through 18-N,n is commonly connected to the output sides of the switching elements 12 which belong to each of the light-receiving element arrays 11a, 11b and 11c (e.g., the second common line 18-1,1 is connected to the switching elements T1,1, T2,1 and TN,1). Each of third common lines 19-1 through 19-N is commonly connected to the second common lines 18-1,1 through 18-N,n which belong to each block (e.g., the third common line 19-1 is connected to the second common lines 18-1,1, 18-2,1, ..., and 18-N,1). And these first common lines 17R1, 17G1 and 17B1 through 17RN, 17GN and 17BN, the second common lines 18-1,1 through 18-N,n, and the third common lines 19-1 through 19-N are not only formed into a multilayer interconnection structure but also provided with load capacitors C1 through Cn constituting electric charge storing means (the construction of the load capacitors C1 through Cn will be described in detail later).

A drive circuit 15 includes: amplifiers 20-1 through 20-n connected to the second common lines of an arbitrarily selected block, e.g., the output sides of the second common lines 18-1,1 through 18-1,n which belong to the first block in the case of this embodiment; reset switches RS1 through RSn connected to the second common lines 18-1,1 through 18-1,n, respectively; read switches SW1 through SWn connected to the output sides of the amplifiers 20-1 through 20-n; and an output line 16 commonly connected to the output sides of the read switches SW1 through SWn. The reset switches RS1 through RSn sequentially operate to reset the electric charges of the load capacitors C1 through Cn by reset signals $\phi R1$ through $\phi Rn$. The read switches SW1 through SWn sequentially operate to output signals from an output terminal Tout through the output line 16 by read signals $\phi S1$ through $\phi Sn$.

Figure 2:
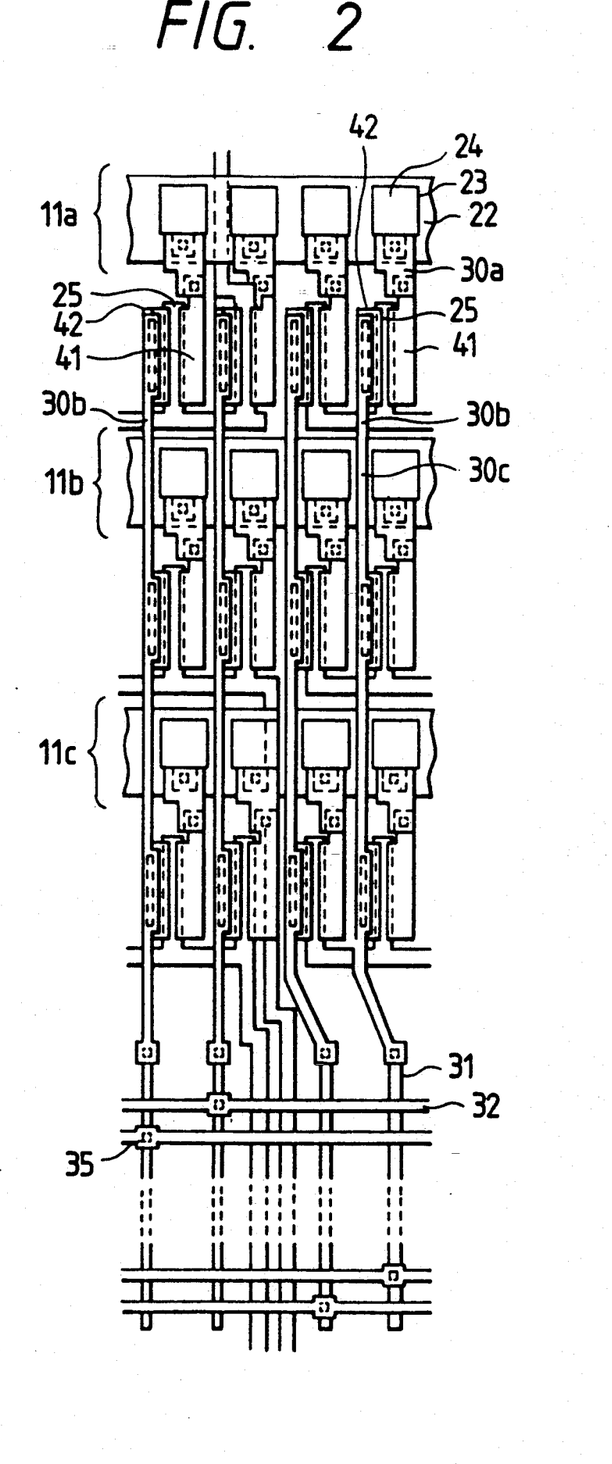
FIG. 2 is a schematic plan view for a description of the image sensor shown in FIG. 1.
Figure 3:
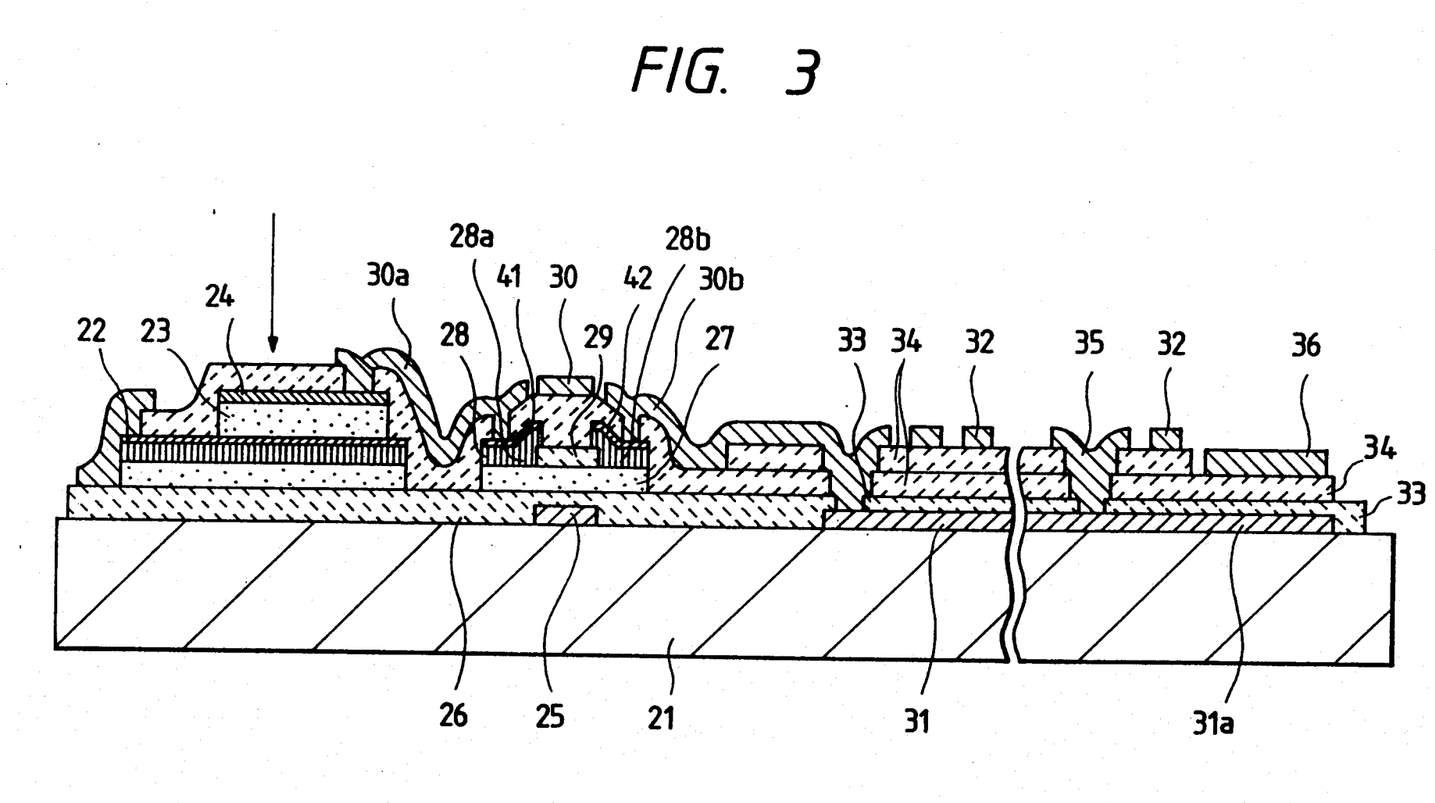
FIG. 3 is a schematic sectional view for a description of the color image sensor shown in FIG. 1.
Figure 4:
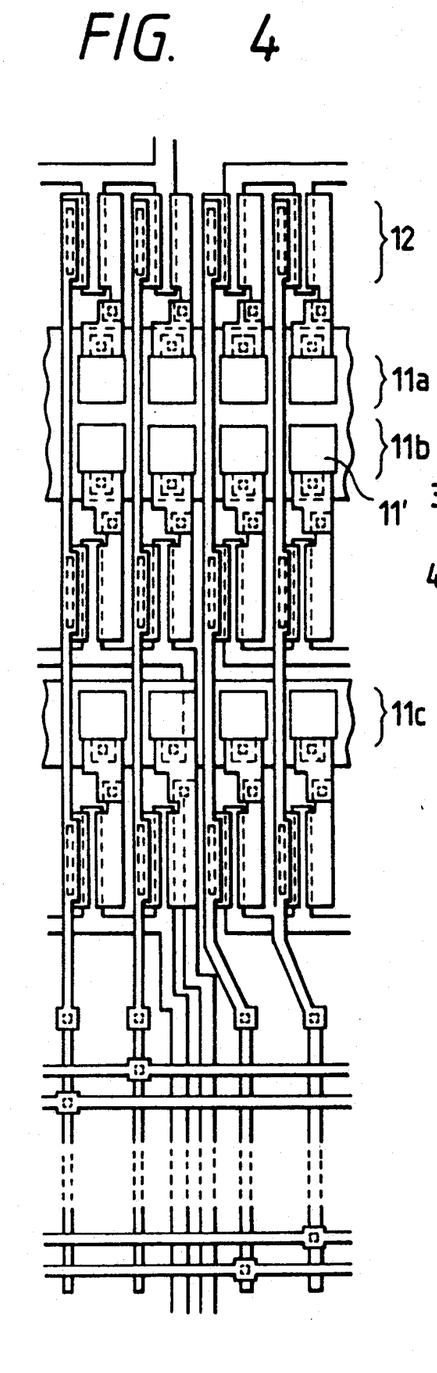
FIG. 4 is a schematic plan view for a description of a color image sensor which is another embodiment of the invention.
Figure 5:
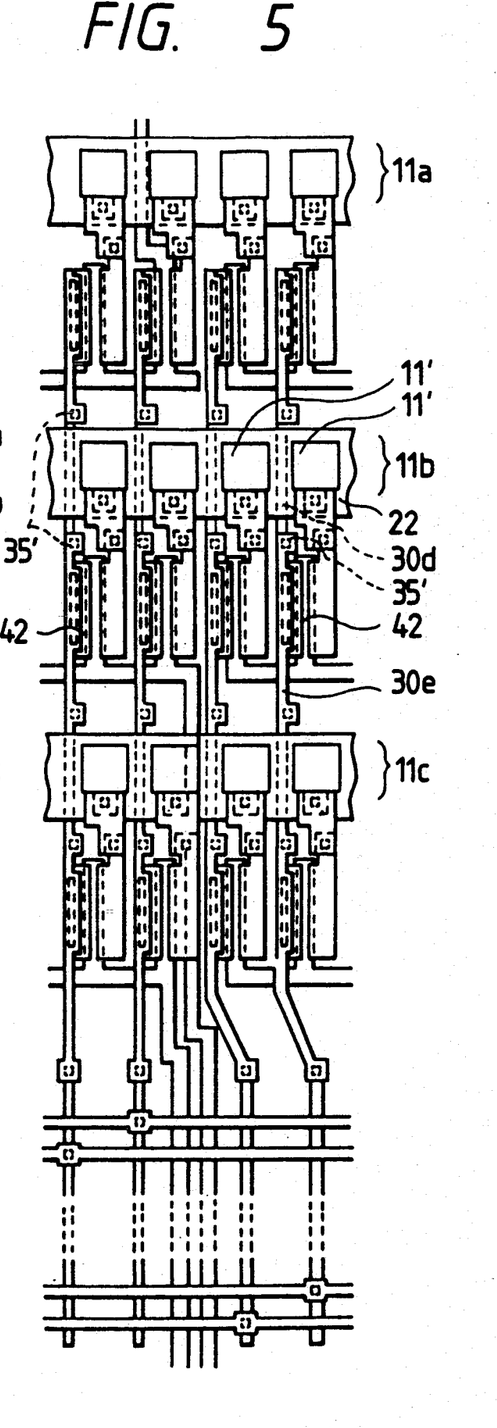
FIG. 5 is a schematic plan view for a description of a color image sensor which is still another embodiment of the invention.

FIG. 2 is a plan view showing the color image sensor shown in FIG. 1, and FIG. 3 is a schematic sectional view for a description of the color image sensor. Each component will be described.

As shown in FIG. 3, each light-receiving element 11' has a sandwiched structure in which a lower belt-like metal electrode 22 made of Cr forming a common electrode, a photoconductive layer 23 made of amorphous silicon hydride (a-Si:H) which is segmented into each light-receiving element 11', and a similarly segmented upper transparent electrode 24 made of indium-tin oxide (ITO) are sequentially deposited on a substrate 21 made of glass. The lower metal electrode 22 extends belt-like in the main scanning direction and the photoconductive layer 23 is sparsely segmented on the metal electrode 22, while the upper transparent electrode 24 is similarly sparsely segmented so as to form individual electrodes. Accordingly, a portion at which the photoconductive layer 23 is interposed between the metal electrode 22 and the transparent electrode 24 constitutes each light-receiving element 11', plural blocks of which constitute the light-receiving element array 11. A group of light-receiving element arrays is formed by arranging three light-receiving element arrays 11 in the auxiliary scanning direction. At a position on each transparent electrode 24 is a not shown color filter for color-separating image data. The color filters are arranged for different colors of the corresponding light-receiving element arrays 11 (e.g., filters for red on light-receiving elements 11'a; filters for green on light-receiving elements 11'b; and filters for blue on light-receiving elements 11'c).

Further, a line 30a made of, e.g., Al is connected to an end of each sparsely segmented transparent electrode 24, while the other end of the line 30a is connected to the drain electrode 41 of each thin film transistor TN,n of the switching element 12. In each light-receiving element 11', a material such as CdSe (cadmium selenide) may be used as a photoconductive layer in place of a-Si:H. The photoconductive layer 23 and the transparent electrode 24 are individualized to reduce interference to be induced between adjacent electrodes by a common layer when the photoconductive layer made of a-Si:H is used as the common layer.

Moreover, the photoconductive layer 23 of each light-receiving element 11' may be made of p-i-n a-Si:H, a-SiC, or a-SiGe. The light-receiving element 11' may also be a photoconductor or phototransistor instead of a photodiode.

Each thin film transistor (TN,n) constituting the switching element 12 is a transistor of a reverse-staggered type. Deposited on the substrate 21 are a Cr layer (Cr1) serving as a gate electrode 25, a silicon nitride (SiNx) film serving as a gate insulating layer 26, an a-Si:H layer serving as a semiconductor activated layer 27, an SiNx film serving as a top insulating layer 29 confronting the gate electrode 25, an n+ a-Si:H layer serving as an ohmic contact layer 28, a Cr layer (Cr2) serving as a drain electrode 41 and a source electrode 42, and an Al layer 30 serving as a line layer in the order written. An insulating layer made of, e.g., polyimide, is interposed between the Al layer 30 and the Cr layer (Cr2).

The ohmic contact layer 28 is separated into a partial layer 28a that is in contact with the drain electrode 41 and a partial layer 28b that is in contact with the source electrode 42. The Cr layer (Cr2) on the ohmic contact layers 28a and 28b is also separated into the drain electrode 41 portion and the source electrode 42 portion. The line 30a extending from the transparent electrode 24 of each light-receiving element 11' is connected to the drain electrode 41. The second common lines include an Al source electrode line 30b and a vertical line 31, and the source electrode line 30b is connected to the source electrode 42 at one end and to the vertical line 31 at the other end. The same effect may be provided by forming the semiconductor activated layer 27 using polycrystalline silicon or the like.

The matrix-like multilayer interconnection section and the load capacitors C1 through Cn will be described next.

The multilayer interconnection section consists of lower vertical lines 31 made of a Cr layer and upper horizontal lines 32 made of an Al layer and serving as the third common lines. The multilayer interconnection section forms a matrix interposing a first insulating layer 33 made of SiNx and a second insulating layer 34 made of polyimide between the vertical lines 31 and the horizontal lines 32. The second insulating layer 34 has a two-layer structure so that crosstalk at intersecting points of the lines can be reduced. The upper and lower lines are connected by contact holes 35. The crosstalk may be prevented by interposing ground lines between the lines arranged in parallel.

The structure of the load capacitors C1 through Cn is as follows. The individual electrodes serving as the lower electrodes 31a of the load capacitors, made of Cr, are sparsely formed on the extension lines of the vertical lines integrally with the vertical lines 31. On these individual electrodes, SiNx of the first insulating layer 33 and polyimide of the second insulating layer 34 are extended to form the insulating layers of the multilayer interconnection section. In the embodiment, the insulating layer 34 has only one layer. And Al-made, belt-like upper electrodes 36 of the load capacitors C1 through Cn are formed on the insulating layer 34 simultaneously with the horizontal lines 32.

The lower lines 31 and the individual electrodes 31a constituting the lower portions of the load capacitors C1 through Cn are prepared by the same photolithographic process, and the upper lines 32 and the upper portions of the load capacitors are also prepared by the same photolithographic process. The multilayer interconnection section and load capacitors thus prepared are covered with a protective film.

A method of preparing the image sensor, which is the embodiment of the invention, will now be described.

A first Cr layer (Cr1) is deposited on an already inspected and cleaned substrate 21 made of, e.g., glass, to a thickness o of about 750 Å by a DC sputtering method. The first Cr layer will constitute the gate electrodes 25 and the lower lines 31 of the multilayer interconnection section. Then, the Cr1 layer is subjected to a photolithographic process and an etching process for patterning. The Cr1 layer thus processed is then subjected to a BHF process and an alkaline cleaning process. Then, to form the gate insulating layer 26, the semiconductor activated layer 27, and the top insulating layer 29 of the TFT section on this Cr1 layer, an SiNx film, an a-Si:H film, and an SiNx film are sequentially deposited to thicknesses of about 3000 Å, about 500 Å, and about 1500 Å, respectively, by a plasma chemical vapor deposition (P-CVD) method while maintaining the vacuum. Here, let the lower gate insulating layer 26 be designated as a bottom SiNx (b-SiNx) while let the upper gate insulating layer 29 be designated as a top SiNx (t-SiNx). The continuous deposition process under the vacuum prevents interfacial contamination, thus contributing to improving the S/N ratio.

The P-CVD conditions for forming the b-SiNx film are: a substrate temperature of 300° to 400° C.; $SiH_4$ and $NH_3$ pressures of 0.1 to 0.5 Torr; an $SiH_4$ flow rate of 10 to 50 sccm; an $NH_3$ flow rate of 100 to 300 sccm; and a radio frequency (RF) power of 50 to 200W.

The P-CVD conditions for preparing the a-Si:H film are: a substrate temperature of 200° to 300° C.; an $SiH_4$ pressure of 0.1 to 0.5 Torr; an $SiH_4$ flow rate of 100 to 300 sccm; and an RF power of 50 to 200W.

The P-CVD conditions for preparing the t-SiNx film are: a substrate temperature of 200° to 300° C.; $SiH_4$ and $NH_3$ pressures of 0.1 to 0.5 Torr; an SiH flow rate of 10 to 50 sccm; an $NH_3$ flow rate of 100 to 300 sccm; and an RF power of 50 to 200W.

To pattern the top insulating layer 29 in a form corresponding to the gate electrode 25, a resist is applied to the surface of the top insulating layer 29, and the thus processed top insulating layer 29 is then exposed with the gate electrode 25 pattern as a mask from the back of the substrate 21, developed, and then has the resist separated therefrom.

The Cr1 layer thus far processed is then subjected to a BHF process, and an n+ a-Si:H film is then deposited thereon to a thickness of about 1000 Å as the ohmic contact layer 28 by the P-CVD method. Then, a second Cr layer (Cr2) is deposited to a thickness of about 1500 Å by a DC magnetron sputtering method. The second Cr layer will constitute the drain electrode 41 and the source electrode 42 of the TFT, and the lower metal electrode 22 of the light-receiving element 11, Then, the a-Si:H film which will constitute the photoconductive layer 23 of the light-receiving element 11, is deposited to a thickness of about 13000 Å by the P-CVD, while an ITO film which will constitute the transparent electrode 24 of the light-receiving element 11' is deposited to a thickness of about 600 Å by the DC magnetron sputtering method. An alkaline cleaning process must precede each deposition.

To form individual electrode of the transparent electrodes 24 of the light-receiving elements 11', the ITO layer is subjected to a photolithographic process and an etching process for patterning. The a-Si:H layer for the photoconductive layer 23 is then dry-etched using the same resist pattern. Here, the second Cr layer (Cr2) for the metal electrode 22 serves as a stopper at the time the a-Si:H layer is dry-etched and thus remains unpatterned. During the dry-etching process, the a-Si:H layer for the photoconductive layer 23 has a side edge which is so sharp that the ITO layer must be etched again before separating the resist. As a result, the etching process is continued from around the back of the ITO layer, forming the ITO layer that has the same size as the a-Si:H layer for the photoconductive layer 23.

The P-CVD conditions for preparing the a-Si:H film are: a substrate temperature of 170° to 250° C.; an $SiH_4$ pressure of 0.3 to 0.7 Torr; an $SiH_4$ flow rate of 150 to 300 sccm; and an RF power of 100 to 200W.

The DC sputtering conditions for preparing the ITO film are: a substrate temperature being at room temperature; Ar and $O_2$ pressures of $5 \times 10^{-3}$ Torr; an Ar flow rate of 100 to 150 sccm, an $O_2$ flow rate of 1 to 2 sccm; and a DC power of 200 to 400W.

Then, the second Cr layer (Cr2), which will constitute the Cr layer for the metal electrode 22 of each light-receiving element 11' and the Cr layer for the drain electrode 41 and the source electrode 42 of each TFT, is subjected to a photolithographic process and to an etching process for patterning. Then, using the same resist pattern, the n+-type a-Si:H layer which will constitute the lower Cr layer for the metal electrode 22 of the light-receiving element 11' and the n+-type a-Si:H layer which will constitute the ohmic contact layer 28 of the TFT are etched.

Then, to pattern the gate insulating layer 26 of the TFT and to form the first interlayed insulating layer 33 of the multilayer interconnection section, the b-SiNx layer is patterned by a photolithographic etching process. After that, a polyimide insulating film is applied to a thickness of about 11500 Å so as to cover the image sensor, pre-baked, patterned by the photolithographic process to form contact portions, and baked again. Similarly, a second polyimide insulating film is applied to a thickness of about 11500 Å, pre-baked, patterned by the photolithographic process, and baked again. Accordingly, the contact portion for energizing the metal electrode 22 and the portion for drawing electric charge from the transparent electrode 24; the contact portion for connecting the lines 30a which serves to transfer the electric charge generated at each light-receiving element 11' and the contact portion for applying the electric charge to the multilayer interconnection section; and the contact holes 35 for connecting the upper and lower lines are formed for each light-receiving element 11', the TFT, and the multilayer interconnection section, respectively. Thereafter, the polyimide layer is subjected to a descumming process using an $O_2$ plasma so that the polyimide layer can completely be removed from the contact holes 35 and the like.

Then, an Al layer is deposited to a thickness of about 15000 Å so as to cover the entire part of the image sensor by the DC magnetron sputtering method and subjected to a photolithographic etching process to obtain a desired pattern. Accordingly, the line portion for energizing the metal electrode 22 and the line 30a portion for drawing the electric charge from the transparent electrode 24 and transferring it to the drain electrode 41 of the TFT, the line 30b portion for leading the electric charge from the source electrode 42 of the TFT to the multilayer interconnection section, and the upper lines 32 in the multilayer interconnection section and the upper common electrode 36 in the load capacitors are formed.

Lastly, a polyimide layer is applied, pre-baked, patterned by the photolithographic etching process, and baked to form a passivation layer (not shown). Thereafter, a descumming process is performed to remove the superfluous polyimide.

Color filters are formed on each light-receiving element array 11; e.g., filters for transmitting red are provided on the first light-receiving element array 11a; filters for transmitting green are provided on the second light-receiving element array 11b; and filters for transmitting blue are provided on the third light-receiving element array 11c. The image sensor is completed by further mounting a drive IC 15 and so forth, wire-bonding, and then assembling.

A method of driving the image sensor, which is the embodiment of the invention, will be described next.

When light is projected from a light source (not shown) onto a document (not shown) placed on the light-receiving element arrays 11, the light reflected therefrom is injected onto each light-receiving element 11' (photodiode), generating electric charge commensurate with the darkness of the document portions and storing the generated electric charge in a parasitic capacitor or the like of each light-receiving element 11'. Since each of the light-receiving element arrays 11a, 11b and 11c has filters for transmitting the wavelength of a specific color (red, green, and blue), the first light-receiving element array 11a interacts with red to generate electric charge; the second light-receiving element array 11b interacts with green to generate electric charge; and the third light-receiving element array 11c interacts with blue to generate electric charge.

When each TFT is turned on based on a gate pulse $\phi G$ from a gate pulse generating circuit (not shown), the electric charge stored at each parasitic capacitor or the like is transferred to and stored at each of the load capacitors C1 through Cn while connecting the photodiodes to the second common signal lines 18-1,1 through 18-N,n. A specific case where electric charge is generated at the photodiodes P1,1 through P1,n of the first block in the first light-receiving element array 11a (interacting with red) will be described. Upon application of a gate pulse $\phi GR1$ from the gate pulse generating circuit, the thin film transistors T1,1 through T1,n of the switching elements are turned on, causing the electric charge generated at the photodiodes P1,1 through P1,n to be transferred to and stored at the load capacitors C1 through Cn via the second lines 18-1,1 through 18-1,n. The thin film transistors T1,1 through T1,n are turned off thereafter. In the above case, it is not necessary to reset the photodiodes since the load capacitance is more than 100 times larger than the parasitic capacitance of the photodiodes.

A timing generating circuit (not shown) sequentially applies the read signals $\phi s1$ through $\phi sn$ to the read switches SW1 through SWn of the drive IC 15 and, with a one-timing delay therefrom, sequentially applies reset signals $\phi R1$ through $\phi Rn$ to reset elements RS1 through RSn of the drive IC 15, respectively. Accordingly, the electric charge stored at the load capacitors C1 through Cn is outputted (from Tout) as image signals, and the electric charge generated at a next block of photodiodes is similarly transferred. Upon completion of reading the first light-receiving element array 11a (interacting with red), the second light-receiving element array 11b (interacting with green) and then the third light-receiving element array 11c (interacting with blue) are similarly read.

The image signals (image data) read from the first through third light-receiving element array 11a through 11c are stored in a memory (not shown) external to the image sensor and synthesized while calculating the distance between the respective light-receiving element arrays.

While the image data is read in accordance with the order of the light-receiving element arrays in the above embodiment, it may be read for each block. That is, as another embodiment, the image sensor may be driven so as to read red data of a first block; green data of the first block; and blue data of the first block; then, the data of the second block, and the data of the third block. For example, to read a document whose width is narrow, the image sensor can effectively be operated in accordance with that narrow width.

What is claimed is:

1. An image sensor comprising:
    a plurality of light-receiving element arrays disposed in an auxiliary scanning direction, each of said light-receiving element arrays including a plurality of consecutive 1 through N blocks disposed in a main scanning direction, each of said blocks including a plurality of consecutive 1 through n light-receiving elements, each of said light-receiving elements including an input for connection to a voltage source, an output, and a switching element, each switching element including a gate, an output, and an input connected to the output of the corresponding light-receiving element;
    first common connection lines, within each block, commonly connecting the gates of the switching elements of said block, each of said first common connection lines including an input for connecting a driving means to said commonly connected gates for simultaneously driving the switching elements of said block;
    second common connection lines connecting the outputs of switching elements of individual light-receiving element arrays, said second common connection lines commonly connecting switching element outputs of corresponding light-receiving elements 1 through n of corresponding blocks 1 through N;
    a plurality of consecutive 1 through n output terminals
    third common connection lines connecting each of said output terminals to the connected switching element outputs of corresponding light-receiving elements 1 through n; and
    electric charge storing means connected to each output terminal for storing an electric charge conducted from a respective light-receiving element by a switching element.

2. An image sensor according to claim 1, wherein said first, second, and third common connection lines comprise a multilayer interconnection structure.

3. An image sensor according to claim 1, further including a plurality of amplifiers corresponding to said 1 through n light-receiving elements constituting each of said blocks, each of said amplifiers being connected to one of said output terminals.

4. A method of driving an image sensor including a plurality of light-receiving element arrays disposed in an auxiliary scanning direction, each of said light-receiving element arrays including a plurality of consecutive 1 through N blocks disposed in a main scanning direction, each of said blocks including a plurality of consecutive 1 through n light-receiving elements, each of said light-receiving elements including an input for connection to a voltage source, an output, and a switching element, each switching element including a gate, an output, and an input connected to the output of the corresponding light-receiving element, first common consecutive lines, within each block, commonly connecting the gates of the switching elements of said block, each of said first common connection lines including an input for connecting a driving means to said commonly connected gates for simultaneously driving the switching elements of said block, second common connection lines connecting the outputs of switching elements of individual light-receiving element arrays, said second common connection lines commonly connecting switching element outputs of corresponding light-receiving elements 1 through n of corresponding blocks 1 through N, a plurality of consecutive 1 through n output terminals, third common connection lines connecting each of said output terminals to the connected switching element outputs of corresponding light-receiving elements 1 through n, and electric charge storing means connected to each output terminal for storing an electric charge conducted from a respective light-receiving element by a switching element, said method comprising the steps of:
    driving the switching elements of each of said plurality of blocks of a selected light-receiving element array to read image signals from said selected light-receiving element array; and
    driving the switching elements of each of said plurality of blocks of other selected light-receiving element arrays to read image signals from said other selected light-receiving element arrays.

5. A method of driving an image sensor including a plurality of light-receiving element arrays disposed in an auxiliary scanning direction, each of said light-receiving element arrays including a plurality of consecutive 1 through N blocks disposed in a main scanning direction, each of said blocks including a plurality of consecutive 1 through n light-receiving elements, each of said light-receiving elements including an input for connection to a voltage source, an output, and a switching element, each switching element including a gate, an output, and an input connected to the output of the corresponding light-receiving element, first common connection lines, within each block, commonly connecting the gates of the switching elements of said block, each of said first common connection lines including an input for connecting a driving means to said commonly connected gates for simultaneously driving the switching elements of said block, second common connection lines connecting the outputs of switching elements of individual light-receiving element arrays, said second common connection lines commonly connecting switching element outputs of corresponding light-receiving elements 1 through n of corresponding blocks 1 through N, a plurality of consecutive 1 through n output terminals, third common connection lines connecting each of said output terminals to the connected switching element outputs of corresponding light-receiving elements 1 through n, and electric charge storing means connected to each output terminal for storing an electric charge conducted from a respective light-receiving element by a switching element, said method comprising the steps of:

driving the switching elements of a selected block of each of said plurality of light-receiving element arrays to read image signals from said selected block of each of said arrays; and driving the switching elements of other selected blocks of each of said plurality of light-receiving element arrays to read image signals from said other selected blocks of each of said arrays.

* * * * *

UNITED STATES PATENT AND TRADEMARK OFFICE
CERTIFICATE OF CORRECTION

PATENT NO. :   5,160,836

DATED      :   November 03, 1992

INVENTOR(S) :  Hiroyuki Miyake

It is certified that error appears in the above-identified patent and that said Letters Patent is hereby corrected as shown below:

Claim 1, column 9, line 68, after "nals" insert --;--.

Signed and Sealed this

Fourth Day of January, 1994

Attest:

BRUCE LEHMAN

Attesting Officer    Commissioner of Patents and Trademarks